US 6,636,825 B1

United States Patent
Malladi et al.

(10) Patent No.: US 6,636,825 B1
(45) Date of Patent: Oct. 21, 2003

(54) COMPONENT LEVEL, CPU-TESTABLE, MULTI-CHIP PACKAGE USING GRID ARRAYS

(75) Inventors: Deviprasad Malladi, Campbell, CA (US); Renukanthan Raman, Los Altos, CA (US); Christopher D. Furman, Gilroy, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/364,832

(22) Filed: Jul. 30, 1999

(51) Int. Cl.$^7$ ............................................... G01R 31/00
(52) U.S. Cl. ....................................... 702/118; 714/718
(58) Field of Search ........................... 74/718, 719–723, 74/42, 25, 26, 30, 31; 324/357, 158.1; 438/14–18, 257; 365/201; 702/117–119, 108, 122, 123, 182–186, 188, FOR 103, FOR 104, FOR 134, FOR 135; 700/79, 121

(56) References Cited

U.S. PATENT DOCUMENTS

| | | | | |
|---|---|---|---|---|
| 5,777,873 A | * | 7/1998 | Cox et al. ..................... 700/79 |
| 5,859,538 A | * | 1/1999 | Self ......................... 324/158.1 |
| 5,867,505 A | * | 2/1999 | Beffa ........................... 714/718 |
| 6,058,055 A | * | 5/2000 | Brunelle ...................... 365/201 |
| 6,249,889 B1 | * | 6/2001 | Rajsuman et al. .......... 714/718 |
| 6,285,962 B1 | * | 9/2001 | Hunter ........................ 702/117 |
| 6,347,287 B1 | * | 2/2002 | Beckett et al. ................ 702/89 |
| 6,363,295 B1 | * | 3/2002 | Akram et al. ................ 700/121 |

* cited by examiner

Primary Examiner—Marc S. Hoff
Assistant Examiner—Mohamed Charioui
(74) Attorney, Agent, or Firm—Martine & Penilla, LLP

(57) ABSTRACT

A method for performing electrical acceptance tests on a sub-system including a test substrate, a microprocessor and one or more associated computer components, such as SRAM, DRAM and ROM. A pin grid array, ball grid array, line grid array or equivalent test connector system is provided that allows direct addressing of selected circuits of the microprocessor and of each associated component. The microprocessor plus substrate are first tested together. If this test is successful, the associated components are then added, preferably one at a time, and the new sub-system is tested. If a particular sub-system fails a test, the cause(s) of failure can be isolated and removed, where possible, and the modified sub-system can be retested.

5 Claims, 5 Drawing Sheets

COMPONENT LEVEL, CPU-TESTABLE, MULTI-CHIP PACKAGE USING GRID ARRAYS

FIELD OF THE INVENTION

This invention relates to electronic testing of one or more layers of a multi-chip semiconductor package.

BACKGROUND OF THE INVENTION

Many computers fabricated today make use of closely spaced multi-chip modules (MCMs) that include several components or modules, such as central processing unit (CPU), static random access memory (SRAM), volatile random access memory (DRAM), read-only memory (ROM) and other devices, connected together for testing and/or operation. This module approach arrangement may reduce the time of flight and/or decrease the amount of noise sensed at any one patch. Where a central processing unit (CPU) for a microprocessor is fabricated using an MCM approach, the CPU must be tested before final assembly to determine if the associated substrate qualifies as a "known good die" (KGD). At present, this KGD testing process is expensive and complex, and the connector pins for the next interconnection level may not (yet) have all the pins required for full CPU testing. Further, in a conventional approach, a microprocessor is connected to the various system components (SRAM, DRAM, ROM, etc.), and the entire assembly is tested together, through use of signals originating in the microprocessor.

Several problems are confronted using this arrangement. First, it may be impossible to test the microprocessor and each of the other components separately, because (1) the components are connected together without a convenient means of separation and (2) the connector provided for testing cannot address some of the components directly, only through the microprocessor or another intermediate component. One result of this is that, if the system fails it can be difficult to determine which component(s) or connection(s) is responsible for the system failure. Another result is that the tests for individual components may be limited by the requirement that a test signal be directed through one or more intermediary components before the test signal is received by the component to be tested. Another result is that system failure will usually require discard of the entire system, including components whose cost is high but for which the probability of failure at the component level is relatively low.

What is needed is an approach that (1) allows electrical testing of individual computer components, (2) allows testing after the system is assembled, (3) allows one or more components to be addressed directly by a test signal, without requiring signal processing by an intermediate component, (4) allows removal of an identified (failed) component in a computer system, without requiring discard of the entire system, and (5) is flexible enough to allow permutation of the order of component assembly and alteration of the test procedure to account for changes in one or more of the components being tested.

SUMMARY OF THE INVENTION

These needs are met by the invention, which provides a method for direct electrical testing of a microprocessor and of individual computer components associated with the microprocessor, using a Pin Grad Array (PGA) or another suitable array of electrical pins that provides direct access to selected circuits within each of the microprocessor and associated components. Use of a pin array allows a selected circuit in a target component, such as a microprocessor or an SRAM, to be interrogated directly and independently of other components, for purposes of evaluating target component performance and identifying reasons for target component failure, if this occurs. Components are added and tested one at a time in order to isolate and repair causes of test failures.

DESCRIPTION OF BEST MODES OF THE INVENTION

Figure 1:
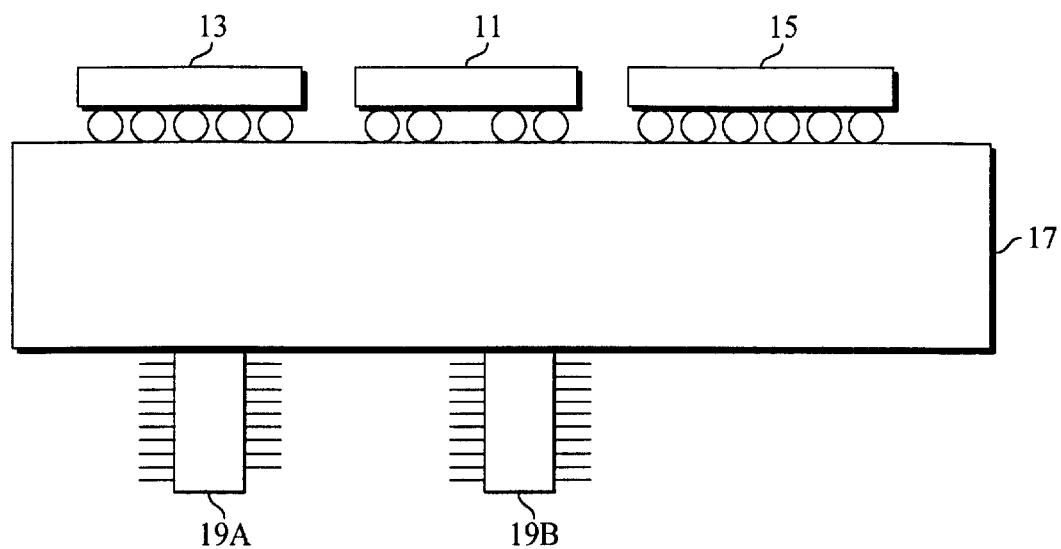
FIG. 1 (Prior Art) schematically illustrates a conventional approach to signal probing and testing on a multi-chip assembly.

FIG. 1 schematically illustrates a conventional approach to probing and testing of a signal on a multi-chip assembly. A microprocessor 11 and one or more associated computer components 13, 15, such as SRAM, DRAM, ROM, etc., are mounted on and connected to a substrate or integrated semiconductor chip 17 that distributes electrical signals. One or more electrical connectors 19A, 19B is connected to the substrate 17 and is used to direct electrical signals through the substrate to the microprocessor 11 and through the microprocessor to the associated component(s) 13, 15. A typical electrical connector 19A may have about 160 electrical connections thereon to introduce electrical signals for probing and/or testing into the microprocessor 11. Some of these signals are introduced into the microprocessor 11 as an intermediary device, to be ultimately directed to an associated target component 13 or 15 that serves the microprocessor. As noted in the preceding, where the microprocessor must serve as an intermediary for direction of a test signal to another target component, the test system may experience one or more limitations in signal voltage, current, slew rate, signal definition, etc. that would not be present if the test signal could be sent directly to the target component.

Figure 2:
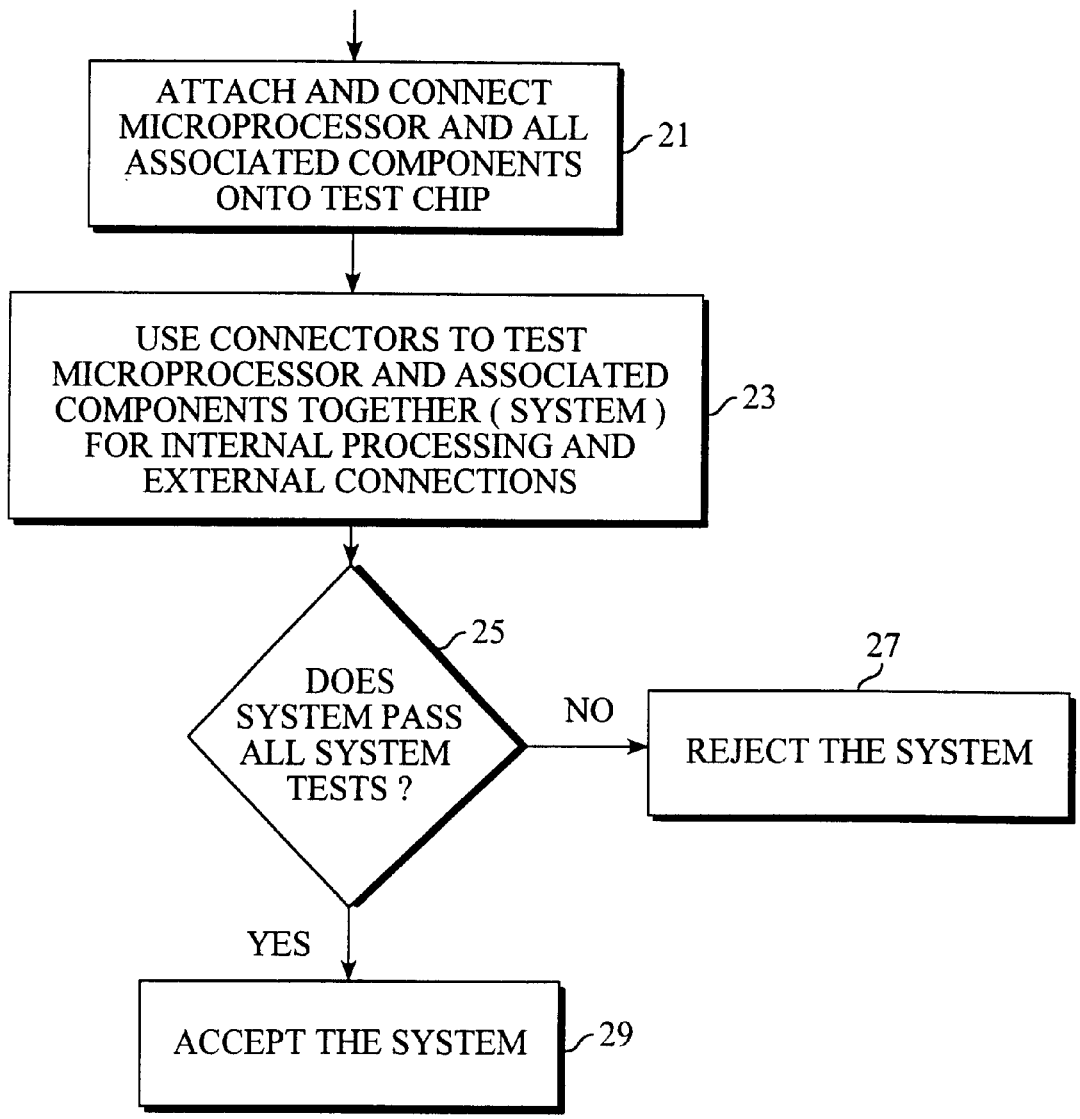
FIG. 2 (Prior Art) is a flow chart illustrating a conventional procedure for testing of a microprocessor and associated components.

FIG. 2 is a flow chart illustrating a conventional or prior art procedure for testing a microprocessor and associated computer components. In step 21, a microprocessor and one or more associated computer components are electrically connected to a substrate for test purposes. In step 23, an electrical connector is connected to the substrate and introduces one or more probe or test signals into the substrate, through the microprocessor and into one or more associated target components. In step 25, a test system determines whether the computer system (microprocessor plus associated components) has passed the test or tests. If the answer to the question in step 25 is "no", the user discards the substrate with the microprocessor and associated components attached, in step 27. If the answer to the question in step 25 is "yes", the test system accepts the substrate, in step 29.

Figure 3A:
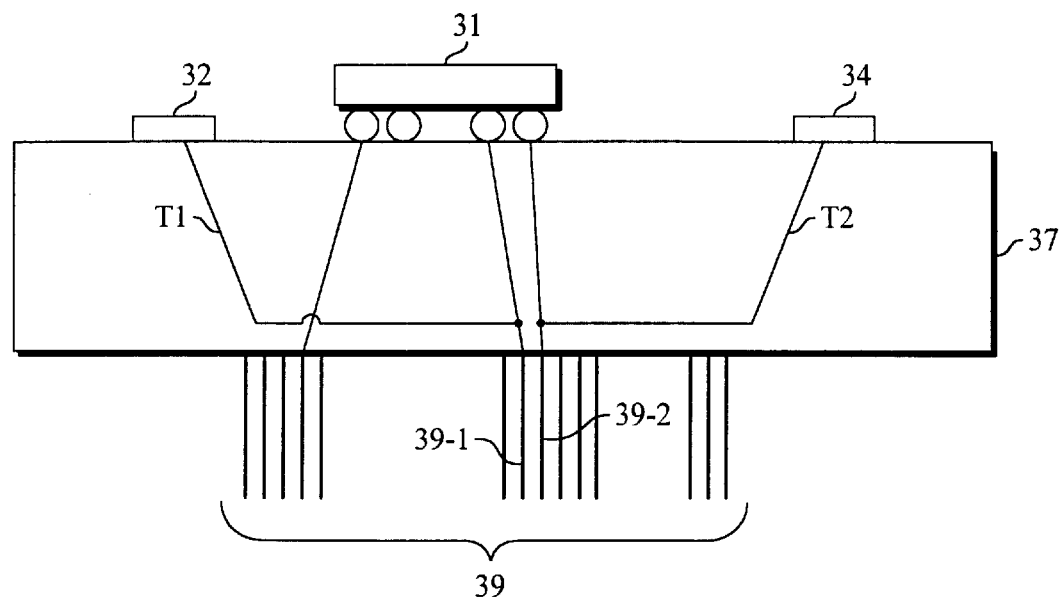
FIGS. 3A, 3B and 3C schematically illustrate a system for signal probing and testing according to the invention.
Figure 3B:
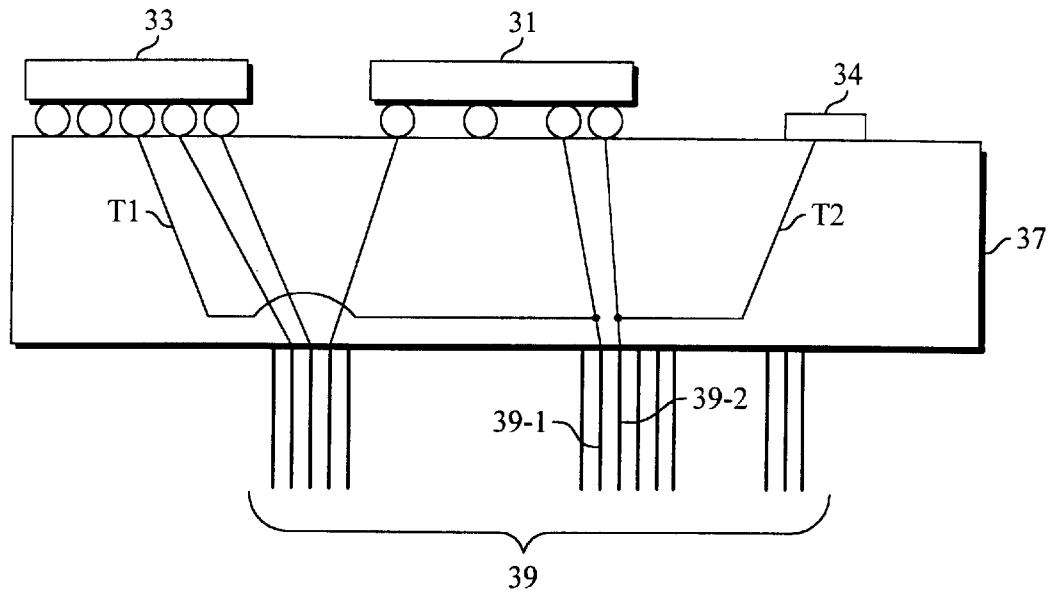
Figure 3C:
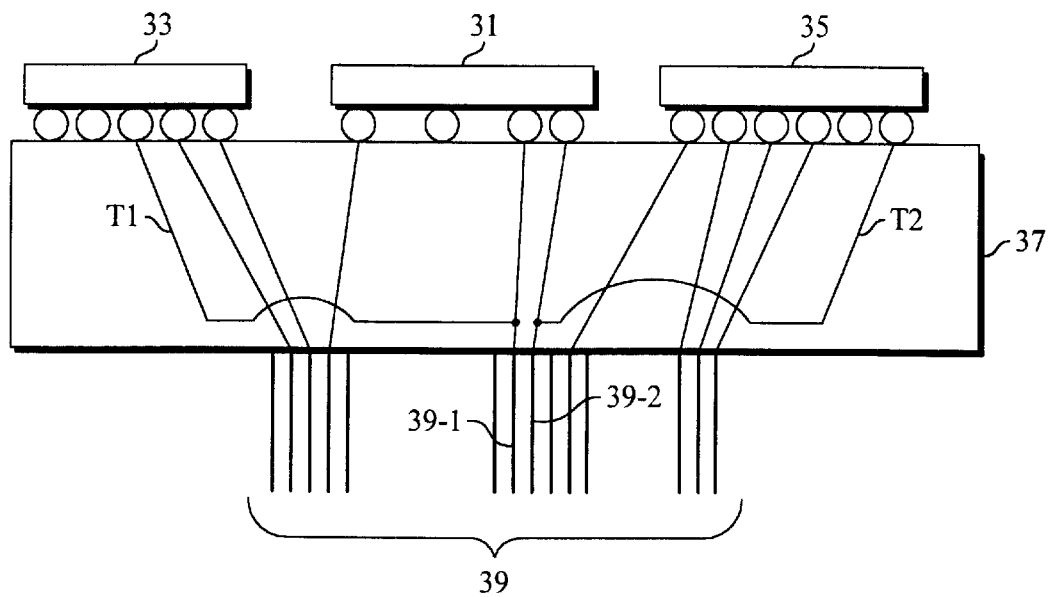

FIGS. 3A, 3B and 3C are schematic illustrations of a test system according to the invention. In FIG. 3A, a microprocessor 31 is mounted on and connected to a substrate or integrated semiconductor chip 37 that distributes electrical signals. A Pin Grid Array, Ball Grid Array, Land Grid Array 39 (referred to collectively as "Grid Arrays"), or another suitable array of electrical pins, is connected to the substrate 37 and is used to direct electrical signals through the substrate to the microprocessor 31. The microprocessor 31 is preferably tested first, without attachment or activation of any of the associated computer components such as SRAM, DRAM and ROM indicated in FIG. 1. A microprocessor has approximately an estimated 20 percent probability of failure in computer testing, whereas an associated component such as an SRAM, DRAM or ROM has an estimated 1–5 percent probability of failure in computer testing. With reference to FIG. 1, where the computer system fails a computer test, the associated components 13, 15 as well as the microprocessor 11 are discarded in a conventional approach, although it is 4 to 20 times as likely that the microprocessor, rather than an associated component, has caused the failure.

If the microprocessor passes its tests, associated components 33, 35 are then attached to and electrically connected to the substrate 37 (FIGS. 3B and 3C), and tests are conducted that address one or more of these associated components. If the computer system, consisting of the microprocessor 31 and the associated components 33, 35, fail this second sequence of tests, the substrate 37 with microprocessor 31 and associated components can be discarded. If the computer system, consisting of the microprocessor 31 and the associated components 33, 35, pass this second sequence of tests, this computer system can be accepted.

With reference to FIG. 3A, optionally, at least one trace T1 is connected at a first end to a first member 39-1 of the grid array 39 and at a second end to a first electrically conducting pad 32, where electrical communication of the grid array member 39-1 with the first pad 32 overrides communication of the grid array member 39-1 with the microprocessor 31, if an associated computer component 33 (FIG. 3B) is present and connected to (or through) the substrate 37. Optionally, at least one trace T2 is connected at a first end to a second member 39-2 of the grid array 39 and at a second end to a second electrically conducting pad 34, where electrical communication of the grid array member 39-2 with the second pad 34 overrides communication of the grid array member 39-2 with the microprocessor 31, if an associated computer component 35 (FIG. 3C) is present and connected to (or through) the substrate 37.

Figure 4A:
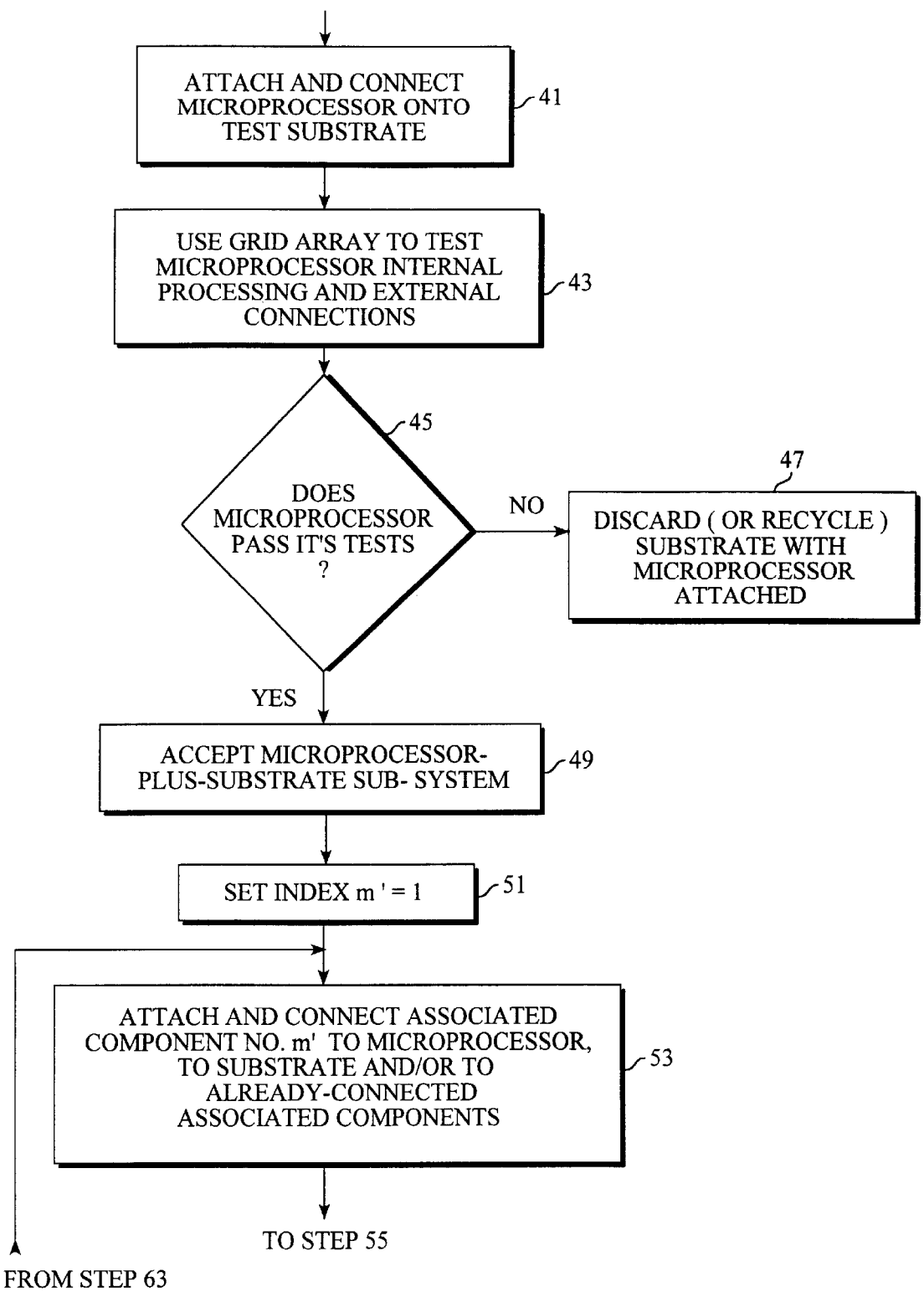
FIGS. 4A and 4B are a flow chart illustrating a procedure for testing of a microprocessor and associated components according to the invention.
Figure 4B:
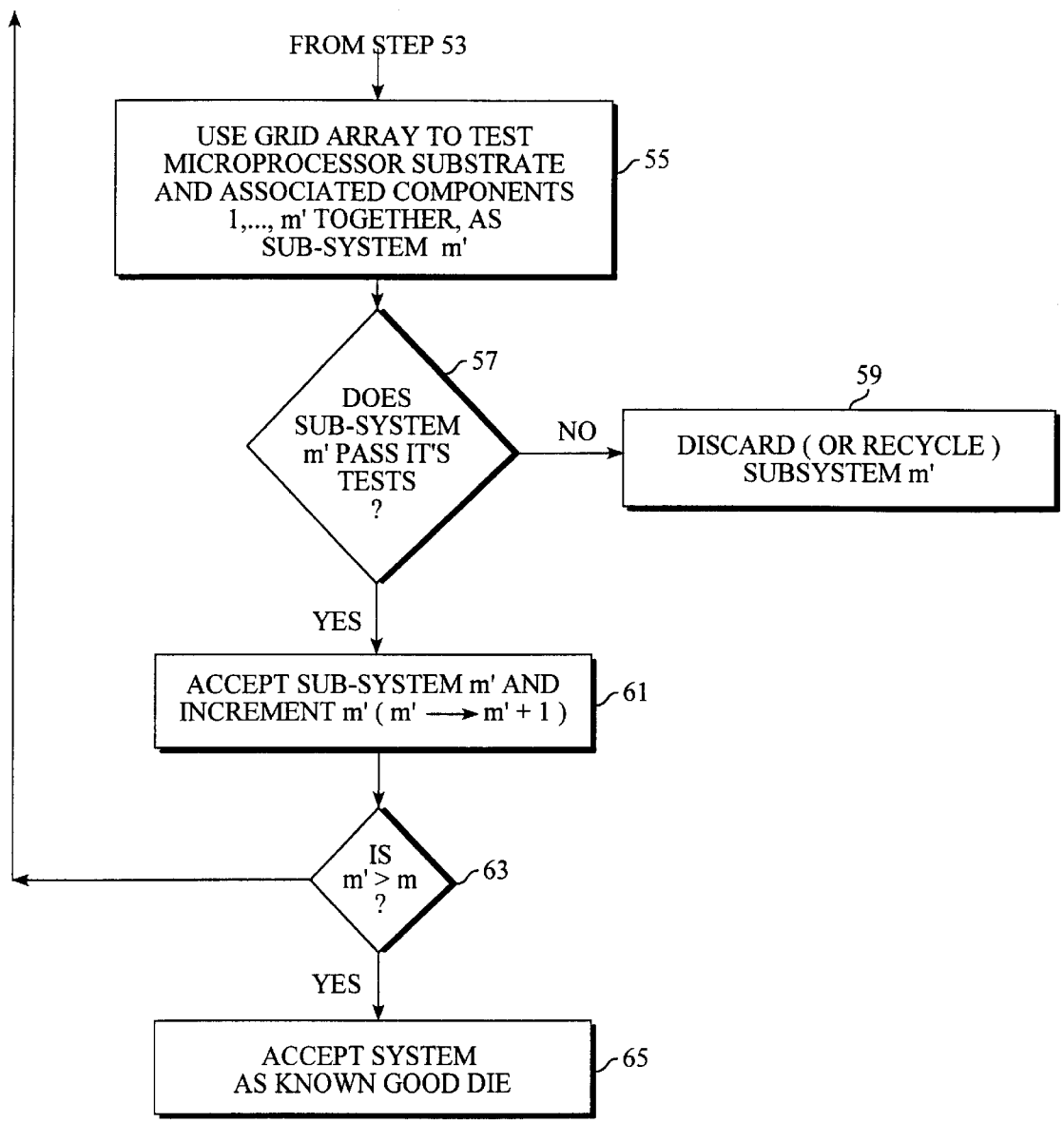

FIGS. 4A and 4B are a flow chart of a suitable procedure for practicing the invention. In step 41, a microprocessor but not the associated computer components, is electrically connected to a substrate for test purposes. In step 43, an electrical connector is connected to the substrate and introduces one or more probe or test signals into the substrate, through the microprocessor. In step 45, a test system determines whether the microprocessor has passed its test or tests. If the answer to the question in step 45 is "no", the user discards the substrate with the microprocessor, in step 47. Alternatively, the microprocessor and the attached substrate may be recycled to retrieve some value from one or more of these items. If the answer to the question in step 45 is "yes", the test system accepts the microprocessor-plus-substrate as a known good die, in step 49, and a first associated component is electrically connected to the substrate and to the microprocessor, in step 51. In step 53, an index m' is set equal to 1.

In step 55, the substrate, the microprocessor and the m' associated components are tested, as a sub-system, by the test system. In step 57, the test system determines whether the sub-system passed its test(s)? If the answer to the question in step 57 is "no", the system discards (or, alternatively, recycles) the combined substrate, microprocessor and m' associated components attached thereto, in step 59. If the answer to the question in step 57 is "yes", the test system accepts this sub-system, in step 61, and increments the index m (m'–m'+1). In step 63, the test system determines whether m'>m, where m is the number of separately testable associated components to be tested. If the answer to the question in step 63 is "no", the test system returns to step 55 (with m' replaced by m'+1) and repeats the steps 55, 57, 61 and 63 at least once. If the answer to the question in step 63 is "yes", the test system accepts the full sub-system, which includes the substrate, the microprocessor and the m associated component, in step 65.

Alternatively, all associated components can be electrically connected to the microprocessor and the substrate, replacing step 55; this new sub-system can be tested, as in step 57; and steps 61 and 63 can be deleted in FIG. 4B.

Assume that the cost of fabrication and installation of the microprocessor 31 in FIG. 3B is \$M, that the average cost of fabrication and installation of each associated component is \$C, that the cost of the substrate is \$S, and that m associated components ($m \geq 1$) are used in the computer system. Assume that the probability of failure of the substrate plus microprocessor 31 is Pr[M} and that the average probability of failure of an associated component is Pr[C] for each associated component.

Using the conventional procedure discussed in connection with FIGS. 1 and 2, the probable cost \$PC for a discarded substrate (for each full test performed on a computer system 10 in FIG. 1) is $$\$PC(\text{old}) = (\$M + m \cdot \$C + \$S)\{Pr[M] \cdot (1 - Pr[C])^m + (1 - Pr[M]) \cdot (1 - (1 - Pr[C])^m)\}. \quad (1)$$

This probable cost is to be compared with the probable cost for a discarded substrate (for each full test performed on a computer system 30 shown in FIGS. 3A and 3B) is $$\$PC(\text{new}) = (\$M + \$S) \cdot Pr[M] + (\$M + \$C + \$S)\{(1 - Pr[M]) \cdot (1 - (1 - Pr[C])^m)\} \quad (2)$$

Assuming that Pr[M]=0.2 and Pr[C]=0.05 and m=3, the probable cost figures for comparison become $$\$PC(\text{old}) = (\$M + \$C + \$S)(0.2856), \quad (3)$$

$$\$PC(\text{new}) = (\$M + \$S)(0.2) + (\$M + \$C + \$S)(0.1141), \quad (4)$$
$$= (\$M + \$C + \$S)\{0.3141 - 0.2 x\},$$

$$x = \$C/(\$M + \$S + \$C). \quad (5)$$

As long as the ratio x is greater than about 0.1425, the probable cost of a failed system, fabricated using the new approach disclosed here, will be less, often much less, than the probable cost of a failed system fabricated using the conventional approach.

Failure of a sub-system (microprocessor plus substrate, with one or more optional associated components) may occur because of circuit processing problems, such as variations in doping concentration for a given layer, variations in volume expansion of an oxidized silicon layer vis-a-vis an adjacent unoxidized silicon layer, variations in registration of a photomask, circuit line misalignments, presence of chemical residues and similar maladies. Sub-system failure may also occur because of the presence of point defects, such as dust or other foreign particles on an image mask, because of variations of a critical (MOS) transistor parameter, such as channel length and threshold voltage, beyond a permissible range for such a parameter, and because of inadequate bonding of test leads or circuit connections.

Where a microprocessor plus substrate, or microprocessor plus substrate plus one or more associated components, is recycled, the yield factor Y, or probability of ultimately producing an acceptable sub-system (one that does not fail its electrical tests) becomes approximately $$Y = Pr[0] + \sum_{k=1}^{K} \eta_k \cdot Pr[k], \quad (6)$$

where $Pr[n]$ ($n=0, 1, 2, \ldots$) is the probability that n defects or causes of test failure will occur for the sub-system, $\eta_k$ is the probability that a sub-system with k defects can be repaired so that the repaired sub-system passes the electrical tests, and K is a selected positive integer, reflecting the practice of discarding a sub-system that is found to have too many defects. In practice, the choice K=1 or K=2 is often made. The actual cost AC per acceptable package is higher than the nominal package cost PC and is approximately given by $$AC = PC/Y \quad (7)$$

so that a higher yield factor produces a lower actual cost per package.

If the quantity $\eta_1 \cdot Pr[1]$ is an appreciable fraction of the zero-defect probability $Pr[0]$, providing an ability to test the microprocessor plus substrate sub-system, and then add and test the associated components one-by-one will increase the yield of microprocessor plus substrate plus all associated components, for at least two reasons. First, the cause(s) of test failure can be more easily isolated and identified by this step-by-step testing. Second, the probability $\eta_k$ that a sub-system with k defects can be successfully repaired, is increased.

A representative 296-lead plastic pin grid array (PPGA) package is discussed in the 1999 Intel Packaging Databook, Section 13.

What is claimed is:

1. A method for testing a computer system, the method comprising:

providing a plurality of N associated computer components, numbered 1, ..., N, with N a selected integer that is at least 2;

providing a plurality of at least N+1 electrical sub-system tests, numbered n=0, 1, 2, ..., N, and initializing the count index n to n=0, where, for at least one sub-system, numbered n' ($0 \leq n' \leq N-1$), sub-system test number n' must be performed before at least one sub-system test number n", with n">n';

electrically connecting a selected microprocessor and an integrated semiconductor substrate together to form a sub-system number 0 and performing the sub-system number 0 test on the sub-system number 0;

(A) when sub-system number n passes the sub-system number n test, incrementing n by 1, electrically connecting sub-system number n−1 and the computer component number n to form a subsystem number n, and performing at least one sub-system number n test on the sub-system number n;

(B) when the sub-system number n fails to pass the at least one sub-system number n test, indicating that the sub-system number n has failed;

(C) when the sub-system number n passes the at least one sub-system number n test, determining whether the integer n satisfies $n \geq N$;

(D) when the integer n does not satisfy $n \geq N$, repeating steps (A), (B) and (C) at least once; and (E) for at least one integer value of the count index, n=n''', satisfying ( ) $\leq n''' \leq N-1$:

receiving at least one sub-system, number n''', that has failed to pass the sub-system number n''' test;

examining the received sub-system number n''' and identifying at least one defect that caused the received sub-system number n''' to fail the sub-system number n''' test, before performing the sub-system number n'''+1 test; and modifying the received sub-system number n''' to remove the at least one defect that is identified in the sub-system number n'''.

2. The method of claim 1, wherein at least one of said process of electrically connecting said sub-system n−1 and said component number n comprises using at least one of a pin grid array, a ball grid array and a land grid array to perform said process of electrically connecting.

3. The method of claim 1, further comprising selecting at least one of said associated computer components from the group of interactive computer components consisting of an SRAM, a DRAM and a ROM.

4. The method of claim 1, further comprising:

for at least one integer value of said count index n satisfying $0 \leq n \leq N$:

applying said sub-number n test to said received and modified sub-system number n; and accepting said received and modified sub-system number n as passing said sub-system number n test, unless said received and modified sub-system number n fails to pass said sub-number n test.

5. The method of claim 1, further comprising:

(F) when said count index n satisfies $n \geq N$, indicating that said sub-system number N is acceptable.

* * * * *